(12) United States Patent
Srinivas et al.

(10) Patent No.: US 7,605,618 B2
(45) Date of Patent: Oct. 20, 2009

(54) DIGITAL OUTPUT DRIVER AND INPUT BUFFER USING THIN-OXIDE FIELD EFFECT TRANSISTORS

(75) Inventors: Vaishnav Srinivas, San Diego, CA (US); Vivek Mohan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 85 days.

(21) Appl. No.: 11/332,118

(22) Filed: Jan. 12, 2006

(65) Prior Publication Data

US 2007/0159218 A1    Jul. 12, 2007

(51) Int. Cl.
 *H03B 1/00* (2006.01)
(52) U.S. Cl. .......................................... 327/108; 326/83
(58) Field of Classification Search ................. 327/108, 327/109, 112; 326/82, 83
See application file for complete search history.

(56) References Cited

U.S. PATENT DOCUMENTS

| | | | | |
|---|---|---|---|---|
| 4,677,317 | A * | 6/1987 | Sakuma | 326/81 |
| 5,440,258 | A * | 8/1995 | Galbi et al. | 327/112 |
| 5,559,464 | A | 9/1996 | Orii et al. | |
| 5,808,480 | A * | 9/1998 | Morris | 326/81 |
| 6,137,339 | A * | 10/2000 | Kibar et al. | 327/333 |
| 6,759,872 | B2 * | 7/2004 | Lai et al. | 326/81 |
| 7,183,817 | B2 * | 2/2007 | Sanchez et al. | 327/112 |
| 7,242,222 | B2 * | 7/2007 | Omata | 326/83 |
| 2003/0173994 | A1 * | 9/2003 | Lai et al. | 326/81 |
| 2005/0040852 | A1 * | 2/2005 | Mentze et al. | 326/81 |
| 2007/0001716 | A1 * | 1/2007 | Sanchez et al. | 327/112 |

FOREIGN PATENT DOCUMENTS

| | | |
|---|---|---|
| EP | 0703665 | 3/1996 |
| EP | 0765035 | 3/1997 |

(Continued)

OTHER PUBLICATIONS

Singh, G. P. et al.: "High-Voltage-Tolerant I/O Buffers with Low-Voltage CMOS Process," IEEE Journal of Solid-State Circuits, vol. 34, No. 11, pp. 1512-1525(Nov. 1999).

(Continued)

*Primary Examiner*—Lincoln Donovan
*Assistant Examiner*—William Hernandez
(74) *Attorney, Agent, or Firm*—Alex C. Chen; Ramin Mobarhan

(57) ABSTRACT

A digital output driver includes a pre-driver and a driver that may be implemented with thin-oxide FETs. The pre-driver generates first and second digital signals based on a digital input signal. The first digital signal has a first voltage range determined by a first (e.g., pad) supply voltage and an intermediate voltage. The second digital signal has a second voltage range determined by a second (e.g., core) supply voltage and circuit ground. The driver receives the first and second digital signals and provides a digital output signal having a third voltage range determined by the first supply voltage and circuit ground. The pre-driver may include a latch and a latch driver. The latch stores the current logic value for the digital input signal. The latch driver writes the logic value to the latch. The latch driver is enabled for a short time duration to write the logic value and is turned off afterward.

29 Claims, 5 Drawing Sheets

FOREIGN PATENT DOCUMENTS

WO  WO9750176  12/1997

OTHER PUBLICATIONS

Annema, A-J et al.: "5.5-V I/O in a 2.5-V 0.25-µm CMOS Technology," IEEE Journal of Solid-State Circuits, vol. 36, No. 3, pp. 582-538 (Mar. 2001).

International Search Report, PCT/US2007/060502 - International Search Authority - European Patent Office, Jun. 1, 2007.

International Preliminary Report on Patentability, PCT/US2007/060502 - International Search Authority - The International Bureau of WIPO - Geneva, Switzerland, Jul. 16, 2008.

Written Opinion, PCT/US2007/060502 - International Search Authority - European Patent Office, Jun. 1, 2007.

Sanchez, H. et al.: "A Versatile 3.3/2.5/1.8-V CMOS I/O Driver Built in a 0.2-µm, 3.5-nm Tox, 1.8-V CMOS Technology," IEEE Journal of Solid-State Circuits, vol. 34, No. 11, pp. 1501-1511 (Nov. 1999).

* cited by examiner

DIGITAL OUTPUT DRIVER AND INPUT BUFFER USING THIN-OXIDE FIELD EFFECT TRANSISTORS

BACKGROUND

I. Field

The present disclosure relates generally to electronics, and more specifically to digital output driver and input buffer for an integrated circuit (IC).

II. Background

Digital ICs are widely used in various applications such as communication devices, computers, consumer electronics, etc. Many digital ICs are fabricated in complementary metal oxide semiconductor (CMOS), which utilizes both N-channel field effect transistors (N-FETs) and P-channel FETs (P-FETs). FETs are also called transistor devices, or simply, devices.

A digital IC may utilize thin-oxide FETs, thick-oxide FETs, or a combination of both thin-oxide and thick-oxide FETs. In general, a thin-oxide FET can operate at a lower supply voltage and has a thin oxide layer, a lower threshold voltage, and a lower breakdown voltage. Conversely, a thick-oxide FET can tolerate a higher supply voltage and has a thick oxide layer, a higher threshold voltage, and a higher breakdown voltage.

Many digital ICs, such as those for processors, are designed with mostly or only thin-oxide FETs. This is because thin-oxide FETs scale readily with smaller transistor sizes made possible by improvements in IC fabrication technology. Furthermore, thin-oxide FETs can operate at lower supply voltages, which results in lower power consumption. Hence, thin-oxide FETs are highly desirable for portable electronics devices that operate on battery power.

A digital IC typically interfaces with one or more external devices, e.g., memory devices. The external devices may use an input/output (I/O) voltage that is higher than the supply voltage for the digital IC. To accommodate the higher I/O voltage, the I/O circuitry within the digital IC may be fabricated with thick-oxide FETs that can handle the higher I/O voltage.

For a digital IC, thin-oxide FETs may be fabricated with some number of masks, which may be dependent on the IC process used to fabricate the digital IC. Thick-oxide FETs may be fabricated with some number of masks in addition to the masks required for the thin-oxide FETs. For a given IC die area, the cost of the IC die is roughly proportional to the total number of masks required to fabricate the IC die. Hence, it is desirable to interface with the higher I/O voltage using only thin-oxide FETs, so that the additional masks needed for thick-oxide FETs can be avoided in order to reduce manufacturing cost.

SUMMARY

There is therefore a need in the art for a digital output driver that can interface with a higher I/O voltage using thin-oxide FETs.

A digital output driver and a digital input buffer that may be implemented with thin-oxide FETs and having good performance are described herein. The digital output driver includes a pre-driver and a driver. The pre-driver receives a digital input signal from circuitry internal to a digital IC and generates first and second digital signals based on the digital input signal. The driver receives the first and second digital signals and provides a digital output signal for an external device. The first digital signal has a first voltage range determined by a first supply voltage and an intermediate voltage. The second digital signal has a second voltage range determined by a second supply voltage and circuit ground. The digital output signal has a third voltage range determined by the first supply voltage and circuit ground. The first supply voltage may be a pad supply voltage, $V_{PAD}$, which is the I/O voltage for the external device. The second supply voltage is lower than the first supply voltage and may be a core supply voltage, $V_{CORE}$, for circuitry within the digital IC.

In an embodiment, the pre-driver includes a latch and a latch driver. The latch stores the current logic value for the digital input signal and may be implemented with two inverters coupled between the first supply voltage and the intermediate voltage. The latch driver writes the logic value to the latch. The latch driver may be enabled for only a short period of time to write the logic value and may be turned off afterward. The latch driver may include (1) a first set of N-FETs stacked together and configured to pull down a first node within the latch to write a logic high to the latch and (2) a second set of N-FETs stacked together and configured to pull down a second node within the latch to write a logic low to the latch. One set of N-FETs may be turned on for a short period of time to write the logic value (e.g., logic high or low) to the latch. The pre-driver may further include a first buffer to buffer the first digital signal and/or a second buffer to buffer the digital input signal.

In an embodiment, the driver includes at least two P-FETs and at least two N-FETs stacked together. The topmost P-FET receives the first digital signal, and the bottommost N-FET receives the second digital signal. For the pre-driver and driver, the number of N-FETs and the number of P-FETs to stack together may be determined based on the first and second supply voltages and voltage limits for the P-FETs and N-FETs.

The digital input buffer as well as various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The digital output driver described herein may be used for various digital ICs. For example, the digital output driver may be used for an application specific integrated circuit (ASIC), a digital signal processor (DSP), a programmable logic device (PLD), a field programmable gate array (FPGA), a processor, a controller, a microprocessor, a radio frequency IC (RFIC), and so on. The digital output driver may also be used for various electronic devices such as wireless communication devices, cellular phones, personal digital assistants (PDAs), portable computers, and so on. For clarity, the digital output driver is described below for an ASIC within a wireless device, e.g., a cellular phone.

Figure 1:
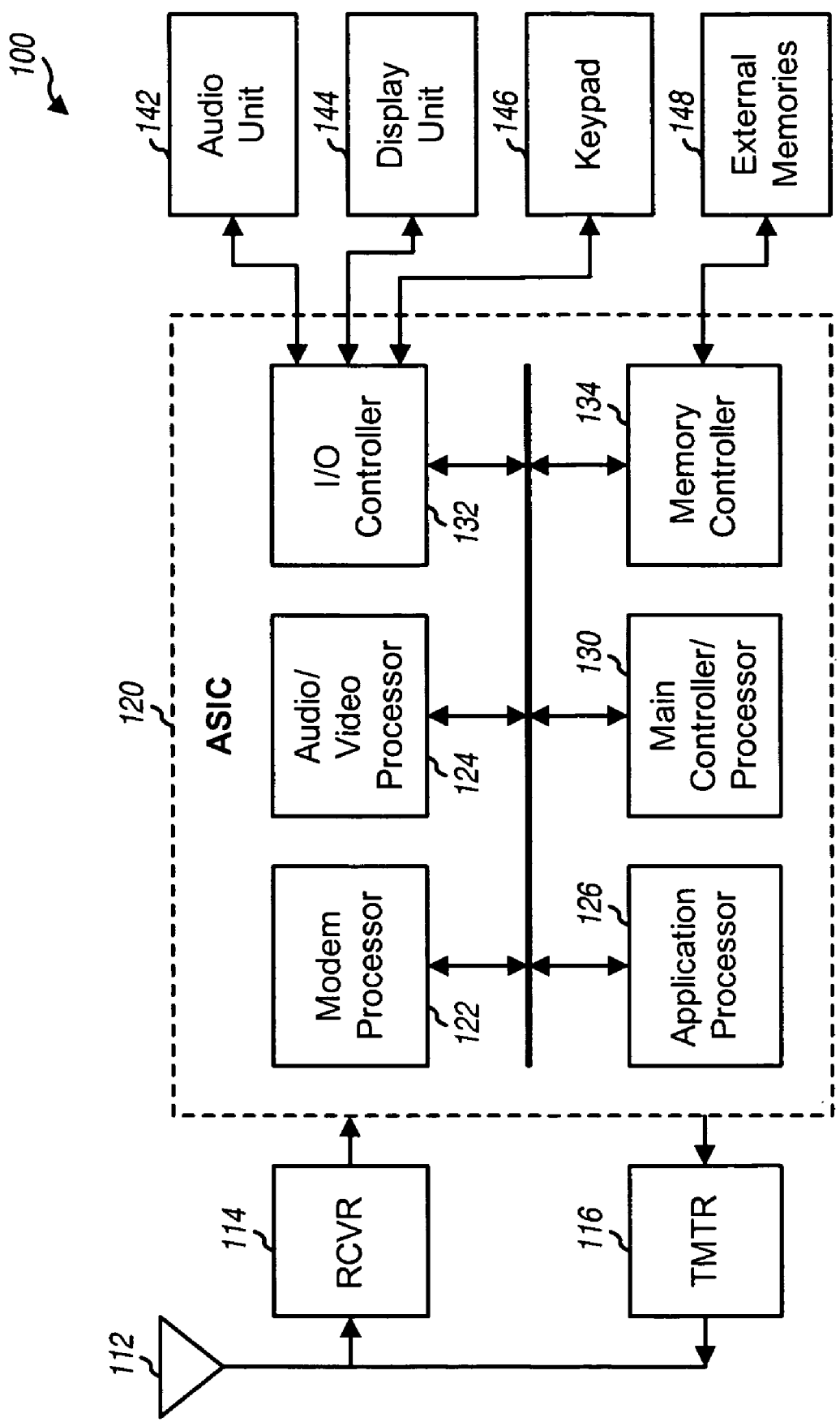
FIG. 1 shows a block diagram of a wireless device.

FIG. 1 shows a block diagram of a wireless device 100. On the receive path, an antenna 112 receives RF signals transmitted by base stations and/or satellites and provides a received RF signal to a receiver (RCVR) 114. Receiver 114 processes (e.g., filters, amplifies, frequency downconverts, and digitizes) the received RF signal and provides samples to an ASIC 120 for further processing. On the transmit path, ASIC 120 processes data to be transmitted and provides data chips to a transmitter (TMTR) 116. Transmitter 116 processes (e.g., converts to analog, filters, amplifies, and frequency upconverts) the data chips and generates an output RF signal, which is transmitted via antenna 112.

ASIC 120 includes various processing units that support communication and other functions. For the embodiment shown in FIG. 1, ASIC 120 includes a modem processor 122, an audio/video processor 124, an application processor 126, a main controller/processor 130, an I/O controller 132, and a memory controller 134. Modem processor 122 performs processing for data transmission and reception, e.g., encoding, modulation, demodulation, decoding, and so on. Audio/video processor 124 performs processing for audio and video. Application processor 126 performs processing for various applications such as, e.g., multi-way calls, web browsing, games, user interface, and so on. I/O controller 132 interfaces with external devices such as an audio unit 142, a display unit 144, and a keypad 146. Memory controller 134 interfaces with external memories 148, which may include SDRAM, Flash, and so on.

Figure 2:
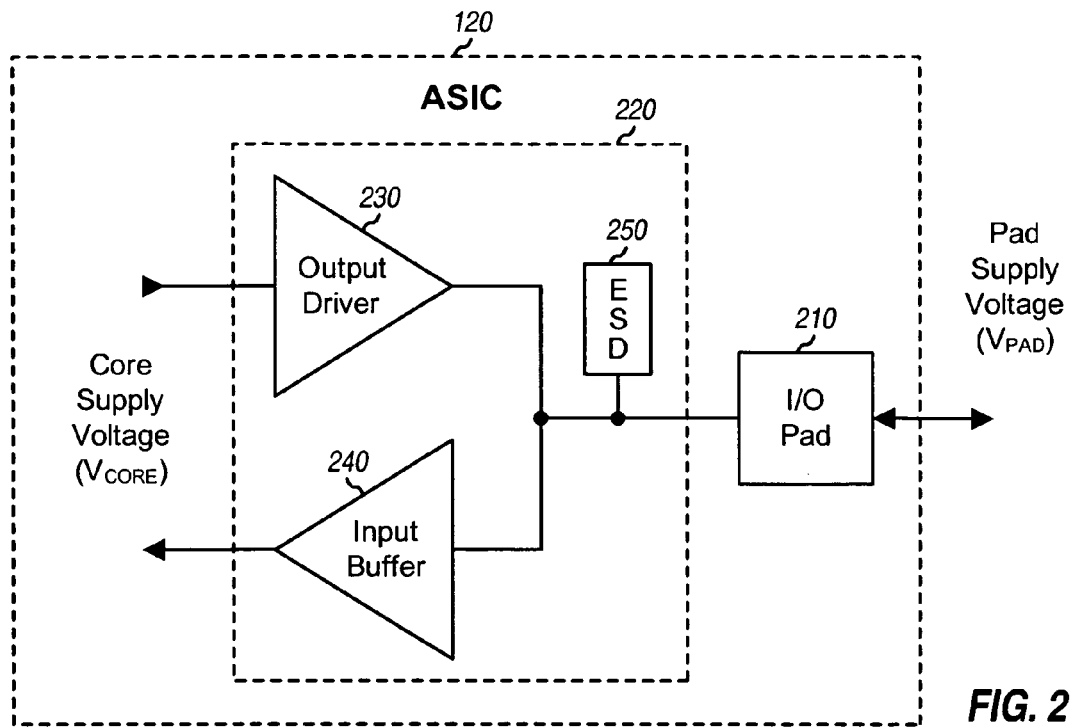
FIG. 2 shows an I/O circuit composed of an output driver and an input buffer.

FIG. 2 shows an exemplary I/O circuit 220 that may be used for a digital I/O pad 210 within ASIC 120 in FIG. 1. I/O pad 210 provides interconnection between circuitry internal to ASIC 120 and external circuitry. I/O pad 210 may be electrically coupled to an external pin of an IC package via a bond wire, a lead frame finger, etc. (not shown in FIG. 1). I/O pad 210 is associated with I/O circuit 220 that provides signal drive and buffering for the I/O pad.

For the embodiment shown in FIG. 2, I/O circuit 220 includes an output driver 230, an input buffer 240, and an electro-static discharge protection device (ESD) 250. Output driver 230 provides level shifting and signal drive for a digital signal being sent by ASIC 120 via I/O pad 210. Output driver 230 may be implemented as described below. Input buffer 240 provides buffering for a digital signal received via I/O pad 210. ESD 250 provides protection against electro-static discharge and may be implemented with a clamp diode that is coupled between a supply voltage and I/O pad 210.

As shown in FIG. 2, the digital signals sent and received via I/O pad 210 are at a higher pad supply voltage, $V_{PAD}$, whereas the digital signals internal to ASIC 120 are at a lower core supply voltage, $V_{CORE}$. For example, $V_{PAD}$ may be 3.3, 2.6 or 1.8 volts (V), and $V_{CORE}$ may be 1.0 or 1.2 volts. Output driver 230 performs level shifting between $V_{CORE}$ and $V_{PAD}$. Output driver 230 should have the following characteristics:

No leakage between the core and pad supply voltages; and
Reliable and correct translation between the core and pad supply voltages.

These desired characteristics may be achieved with the output driver described below.

Figure 3:
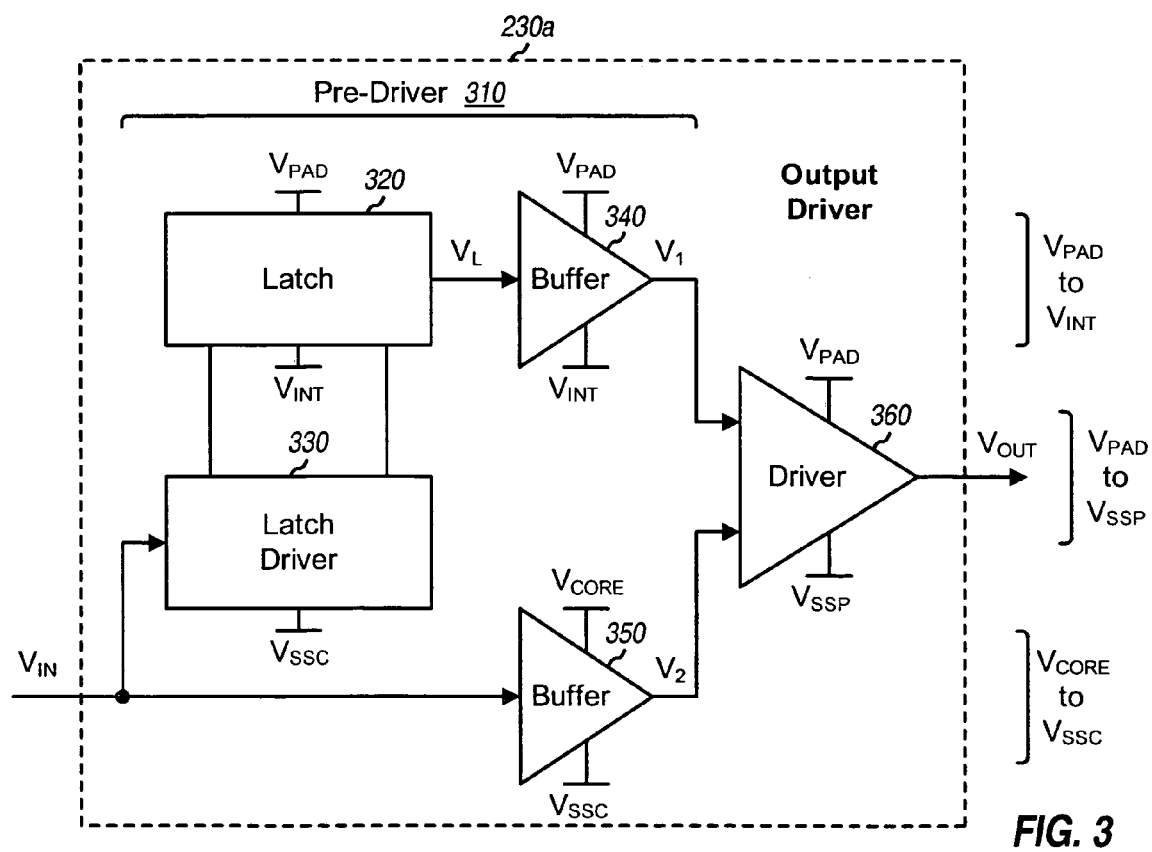
FIG. 3 shows a block diagram of the output driver.

FIG. 3 shows a block diagram of an output driver 230a, which is an embodiment of output driver 230 in FIG. 2. For this embodiment, output driver 230a includes a pre-driver 310 and a driver 360. Pre-driver 310 includes a latch 320, a latch driver 330, and buffers 340 and 350. Latch driver 330 receives a digital input signal $V_{IN}$ from circuitry within ASIC 120, detects for a change in logic value on the $V_{IN}$ signal, and writes the detected logic value to latch 320. Latch 320 stores the logic value written by latch driver 330 and provides a latch output signal, $V_L$. Buffer 340 buffers the $V_L$ signal and provides a first driver signal, $V_1$. Buffer 350 buffers the $V_{IN}$ signal and provides a second driver signal, $V_2$. The $V_1$ and $V_2$ signals have the same logic value but are at different voltage levels. Driver 360 receives the $V_1$ and $V_2$ signals and provides a digital output signal, $V_{OUT}$, for an associated I/O pad 210.

FIG. 3 shows the supply voltages for each circuit element within output driver 230a. Latch 320 operates between $V_{PAD}$ and an intermediate supply voltage, $V_{INT}$. Latch driver 330 operates between an upper voltage (which may be $V_{CORE}$ or $V_{INT}$) and a low supply voltage $V_{SSC}$, which is typically circuit ground or 0V. Buffer 340 operates between $V_{PAD}$ and $V_{INT}$. Buffer 350 operates between $V_{CORE}$ and $V_{SSC}$. Driver 360 operates between $V_{PAD}$ and a low supply voltage $V_{SSP}$, which is also typically circuit ground or 0V.

FIG. 3 also shows the range of voltages for each signal within output driver 230a. The $V_{IN}$ and $V_2$ signals have a range of 0V to $V_{CORE}$. The $V_L$ and $V_1$ signals have a range of $V_{INT}$ to $V_{PAD}$ and are thus shifted up to the higher pad supply voltage. The $V_{OUT}$ signal has a range of 0V to $V_{PAD}$. As indicated in FIG. 3, the signals along the lower signal path are at the same voltage range as the digital signals internal to ASIC 120. The signals along the upper signal path are at a higher voltage range between $V_{INT}$ and $V_{PAD}$.

$V_{INT}$ may be generated to satisfy the following conditions:

$$V_{INT} \geq V_{PAD} - V_{gs\_max}, \text{ and} \qquad \text{Eq (1)}$$

$$V_{INT} < V_{PAD} - \eta \cdot |V_{tp}|, \qquad \text{Eq (2)}$$

where $V_{gs\_max}$ is the maximum gate-to-source voltage for a thin-oxide FET;

$V_{tp}$ is the threshold voltage for the thin-oxide P-FETs used in driver 360; and $\eta$ is a scaling factor.

For example, considering only the condition in equation (1), if $V_{PAD}=2.7V$ and $V_{gs\_max}=1.4V$, then $V_{INT} \geq 1.3V$. As another example, if $V_{PAD}=1.8V$ and $V_{gs\_max}=1.4V$, then $V_{INT} \geq 0.5V$. With $V_{INT}$ defined as shown in equation (1), a digital signal in the upper signal path would have a voltage that is less than or equal to $V_{PAD}$ for logic high and a voltage that is greater than or equal to $V_{PAD}-V_{gs\_max}$ for logic low. The condition in equation (1) ensures that the maximum voltage across any two terminals of a FET in the upper signal path is within specified limits when the FET is turned on and conducting current. The condition in equation (2) ensures that the P-FETs in driver 360 turn on. $\eta$ may be set to 2 or 3 to ensure that the P-FETs fully turn on. $V_{INT}$ may be generated in various manners such as with an on-chip voltage regulator, a current-source bias circuit, etc. $V_{INT}$ may also be an external voltage that is provided to ASIC 120. $V_{INT}$ may also be designed to track $V_{PAD}$ so that $V_{gs\_max}$ is not violated.

In general, the FETs may be stacked, and $V_{INT}$ may be generated such that (1) the maximum voltage applied across the gate and source or drain, $V_{gs\_max}$, and (2) maximum voltage applied across the drain and source, $V_{ds\_max}$, are both satisfied for each of the FETs. Stacking and increased channel lengths tend to reduce issues relating to $V_{ds}$, and $V_{gs}$ and $V_{gd}$ become the more critical parameter.

Figure 4:
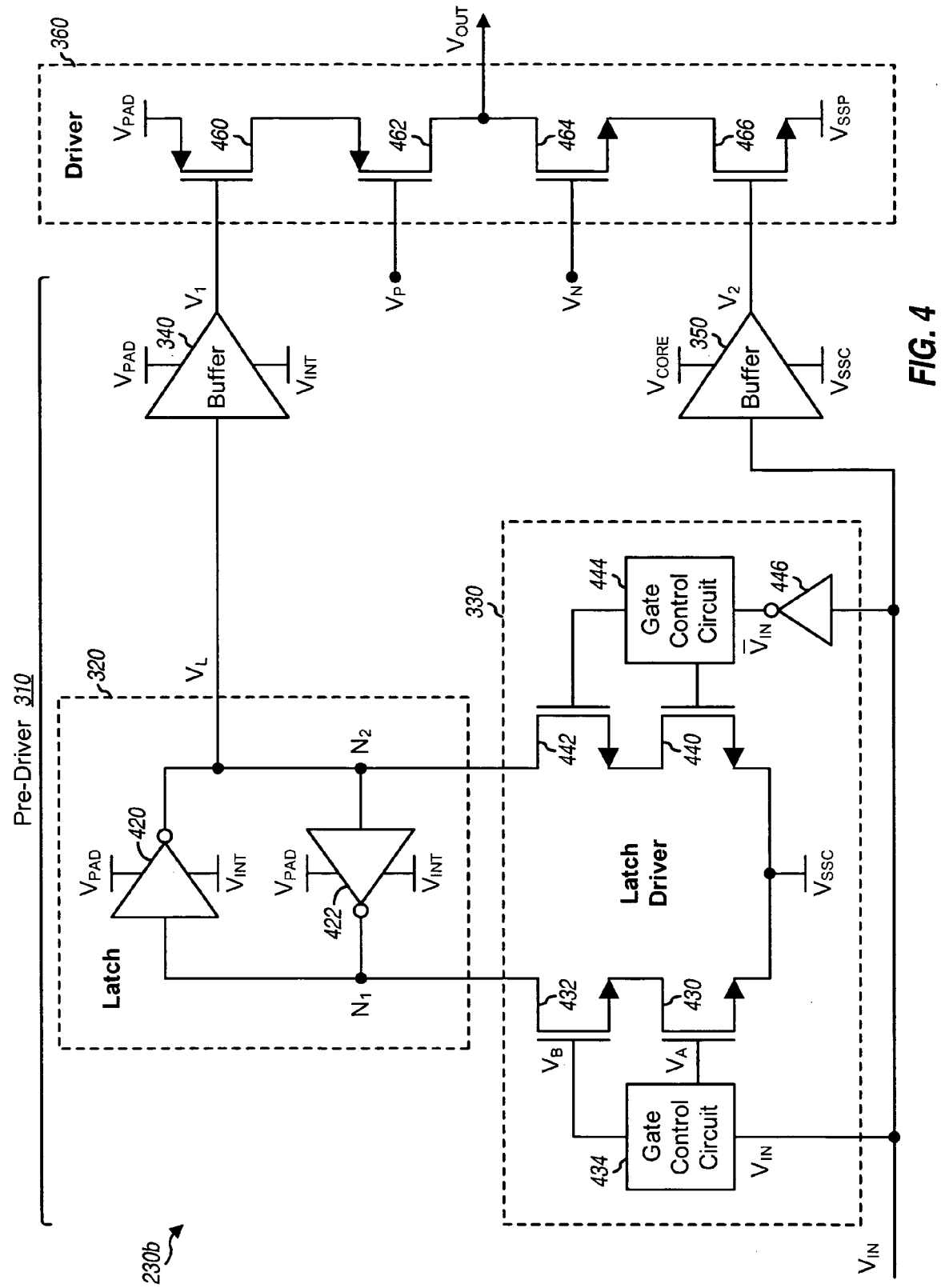
FIG. 4 shows a schematic diagram of the output driver.

FIG. 4 shows a schematic diagram of an output driver 230b, which is an embodiment of output driver 230a in FIG. 3. For this embodiment, latch 320 includes two inverters 420 and 422 that are coupled back-to-back. The output of inverter 420 couples to the input of inverter 422, and the output of inverter 422 couples to the input of inverter 420. Each inverter couples to $V_{PAD}$ for the upper supply voltage and to $V_{INT}$ for the lower supply voltage. Each inverter provides a digital output signal having a voltage range of $V_{INT}$ to $V_{PAD}$.

For the embodiment shown in FIG. 4, latch driver 330 includes N-FETs 430, 432, 440 and 442, gate control circuits 434 and 444, and an inverter 446. N-FETs 430 and 432 are stacked and form the left branch. N-FET 430 has its source coupled to $V_{SSC}$ and its drain coupled to the source of N-FET 432. N-FET 432 has its drain coupled to node $N_1$, which is the input of inverter 420. The gates of N-FETs 430 and 432 are coupled to gate control circuit 434, which also receives the $V_{IN}$ signal. N-FETs 440 and 442 are also stacked and form the right branch. N-FET 440 has its source coupled to $V_{SSC}$ and its drain coupled to the source of N-FET 442. N-FET 442 has its drain coupled to node $N_2$, which is the input of inverter 422. The gates of N-FETs 440 and 442 are coupled to gate control circuit 444, which also receives a $\overline{V}_{IN}$ signal. Inverter 446 receives the $V_{IN}$ signal and provides the $\overline{V}_{IN}$ signal, which is an inverted $V_{IN}$ signal.

Latch 320 and latch driver 330 operate as follows. Initially, the right and left branches of latch driver 330 are turned off. A branch may be turned off by turning off one or both N-FETs in the branch. If the $V_{IN}$ signal transitions from logic low (approximately 0V) to logic high (approximately $V_{CORE}$), then N-FETs 430 and 432 are turned on for a short period of time by gate control circuit 434 and pull down node $N_1$ to logic low. After the short period of time, N-FET 430 and/or N-FET 432 are turned off by gate control circuit 434. Latch 320 latches and retains the logic low at node $N_1$. In particular, inverter 420 senses the logic low at node $N_1$ and provides a logic high at node $N_2$, and inverter 422 senses the logic high at node $N_2$ and provides a logic low at node $N_1$.

Conversely, if the $V_{IN}$ signal transitions from logic high to logic low, then N-FETs 440 and 442 are turned on for a short period of time by gate control circuit 444 and pull down node $N_2$ to logic low. After the short period of time, N-FET 440 and/or N-FET 442 are turned off by gate control circuit 444. Latch 320 latches and retains the logic low at node $N_2$. In particular, inverter 422 provides a logic high at node $N_1$, and inverter 420 provides a logic low at node $N_2$.

Latch driver 330 thus "writes" a zero to either node $N_1$ or $N_2$ depending on the logic value of the $V_{IN}$ signal. The left branch is turned on to write a zero to node $N_1$, and the right branch is turned on to write a zero to node $N_2$. When the left branch is turned on, current flows through N-FETs 430 and 432, the drain of N-FET 430 rises, and the voltage at node $N_1$ is divided across both N-FETs 430 and 432. If N-FETs 430 and 432 have the same size or dimension, then the voltage at node $N_1$ is divided evenly across N-FETs 430 and 432.

FIG. 4 shows an embodiment in which two N-FETs are stacked for each branch. In general, the number of N-FETs to stack for each branch, L, may be given as:

$$L \geq \lceil V_{PAD}/V_{gs\_max} \rceil, \qquad \text{Eq (3)}$$

where "⌈ ⌉" denotes a ceiling operator that provides the next larger integer value for $V_{PAD}/V_{gs\_max}$. For example, two stacked N-FETs should be used for each branch if $V_{PAD}$=1.8V and $V_{CORE}$=1.2V. Three stacked N-FETs should be used for each branch if $V_{PAD}$=2.6V and $V_{CORE}$=1.2V, etc. Using a sufficient number of N-FETs for each branch ensures that (1) the maximum voltage applied across the gate and the drain or source is within $V_{gs\_max}$ and (2) the maximum voltage applied across the drain and source is within $V_{ds\_max}$ for each N-FET when the N-FET is turned on and conducting.

Figure 5:
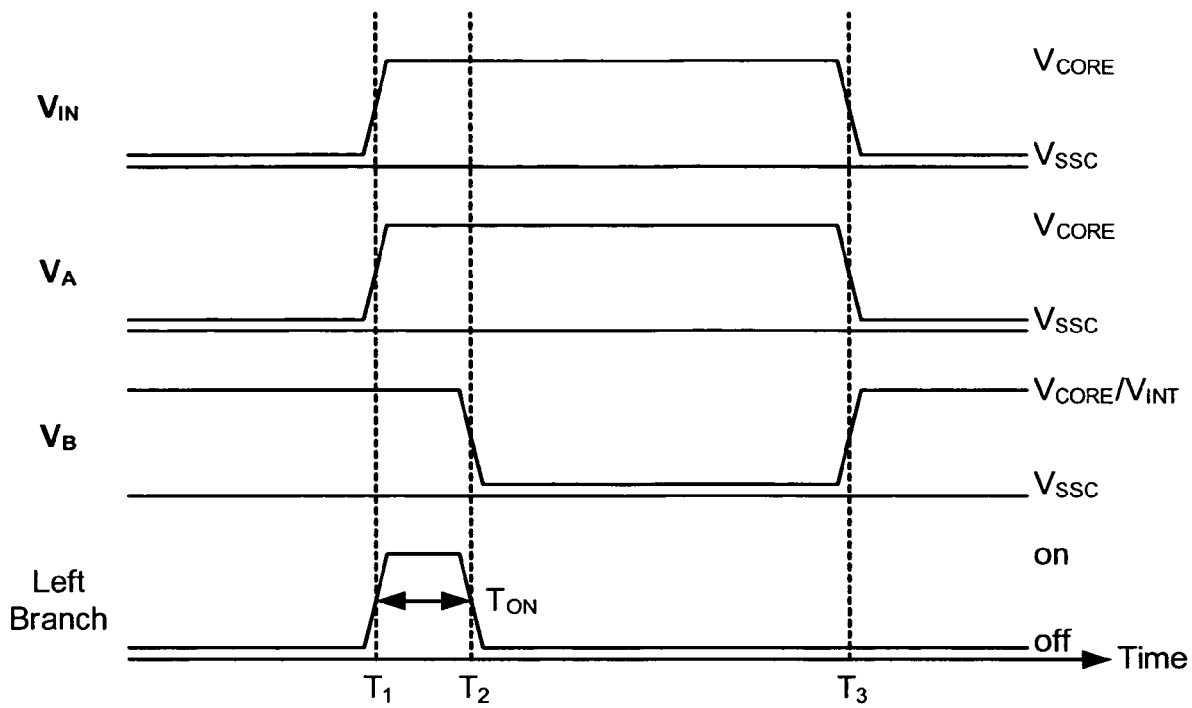
FIG. 5 shows a timing diagram for digital signals for a latch driver within the output driver.

FIG. 5 shows an exemplary timing diagram for the $V_{IN}$ signal as well as the $V_A$ and $V_B$ signals provided to the gates of N-FETs 430 and 432, respectively, in FIG. 4. For this embodiment, the $V_{IN}$ and $V_A$ signals are initially at logic low, and the $V_B$ signal is at logic high. N-FET 430 is turned off, N-FET 432 is turned on, and the left branch is turned off. At time $T_1$, the $V_{IN}$ signal transitions from logic low to logic high, and the $V_A$ signal also transitions to logic high. N-FETs 430 and 432 are both turned on, and the left branch is turned on and pulls node $N_1$ to logic low. A short time later, at time $T_2$, the $V_B$ signal transitions to logic low. N-FET 432 is turned off, and the left branch is turned off. Thus, N-FETs 430 and 432 are both turned on for only a short time duration $T_{ON}$ between times $T_1$ and $T_2$. At time $T_3$, the $V_{IN}$ signal transitions from logic high to logic low, the $V_A$ signal also transitions to logic low, and the $V_B$ signal transitions to logic high. N-FET 430 is turned off, N-FET 432 is turned on, and the left branch remains off.

In general, the $V_A$ signal for N-FET 430 and the $V_B$ signal for N-FET 432 may be generated in various manners such that the left branch is enabled for a time period that is sufficiently long to write a zero to node $N_1$. FIG. 5 shows one embodiment of the $V_A$ and $V_B$ signals. In another embodiment, the $V_A$ and $V_B$ signals are swapped so that N-FET 430 is turned off when the $V_{IN}$ signal is at logic high. In yet another embodiment, the $V_A$ and $V_B$ signals both transition to logic high at time $T_1$, and the $V_A$ signal and/or the $V_B$ signal transition to logic low at time $T_2$. The $V_A$ and $V_B$ signals may also be defined in other manners. The $V_A$ and $V_B$ signals may be generated based on the $V_{IN}$ signal, the $\overline{V}_{IN}$ signal, or both the $V_{IN}$ and $\overline{V}_{IN}$ signals.

FIG. 5 also shows an exemplary range of voltages for each of the $V_{IN}$, $V_A$ and $V_B$ signals for a case in which two N-FETs 430 and 432 are stacked together. If more than two N-FETs are stacked together, then the gate control signal for each N-FET is within a suitable voltage range that may be determined by the position of that N-FET within the stack of N-FETs. The gate control signal for each N-FET is generated such that (1) $V_{gs}$ and $V_{ds}$ for that N-FET are within $V_{gs\_max}$ and $V_{ds\_max}$, respectively, and (2) the N-FET is turned on to a sufficient and needed extent.

Figure 6:
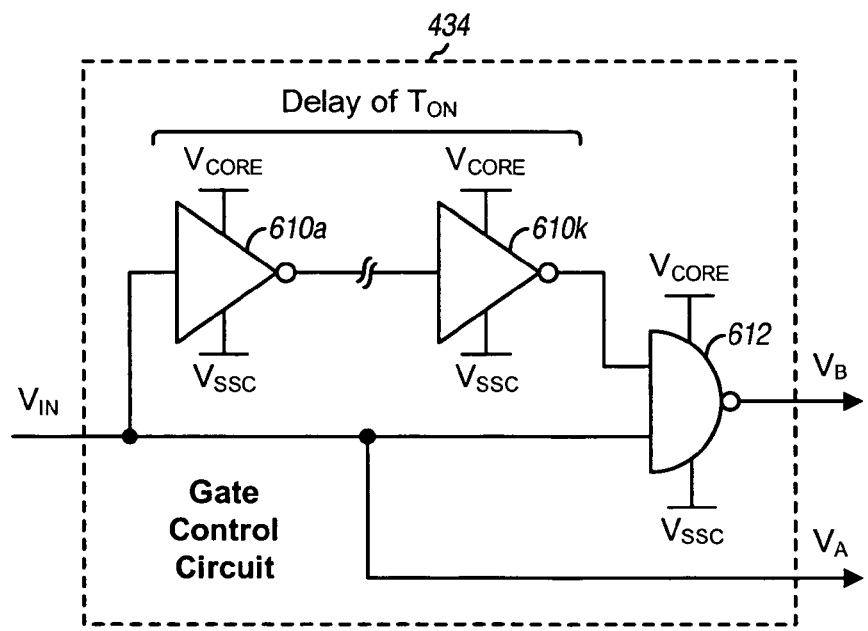
FIG. 6 shows a schematic diagram of a gate control circuit within the latch driver.

FIG. 6 shows an embodiment of gate control circuit 434 that can generate the $V_A$ and $V_B$ signals shown in FIG. 5 for N-FETs 430 and 432, respectively. For this embodiment, gate control circuit 434 includes K series-coupled inverters 610a through 610k and a NAND gate 612, where K is an even integer that is greater than one. The $V_{IN}$ signal is provided directly as the $V_A$ signal. The $V_{IN}$ signal is also provided to the input of inverter 610a and delayed by inverters 610a through 610k, which provides a total delay of $T_{ON}$. NAND gate 612 receives the $V_{IN}$ signal on one input and the delayed $V_{IN}$ signal from inverter 610k on another input and provides the $V_B$ signal for N-FET 432.

The embodiment shown in FIGS. 5 and 6 provides some desirable characteristics. First, the $V_B$ signal follows the $V_A$ signal, even on the falling edge of the $V_A$ signal at time $T_3$ in FIG. 5. This ensures that N-FET 430 is turned off before N-FET 432 is turned on. The left branch thus remains off during the falling edge of the $V_{IN}$ and $V_A$ signals at time $T_3$ and does not disturb the charge stored at node $N_1$. Second, any desired $T_{ON}$ delay may be achieved by using a sufficient number of inverters 610.

FIG. 6 shows an embodiment for generating the $V_A$ and $V_B$ signals shown in FIG. 5. These signals may also be generated with other circuits, and this is within the scope of the invention. As noted above, the $V_A$ and $V_B$ signals may also be defined in other manners, and other circuits may be used to generate these other versions of the $V_A$ and $V_B$ signals. The gate control signals for N-FETs 440 and 442 for the right branch of latch driver 330 may be generated in the same manner as the $V_A$ and $V_B$ signals for N-FETs 430 and 432.

Referring back to FIG. 4, the parasitic capacitance at node $N_1$ and the drive capability of N-FETs 430 and 432 determine the amount of time to turn on the N-FETs in order to pull down node $N_1$ to logic low. In one embodiment, which is shown in FIG. 6, N-FETs 430 and 432 are turned on for a fixed time duration $T_{ON}$, which may be longer than or equal to the expected amount of time needed to pull node $N_1$ to logic low. In another embodiment, N-FETs 430 and 432 are turned on for a variable time duration determined by a sense circuit. The sense circuit senses the voltage at node $N_1$ and turns off N-FET 430 and/or 432 when this voltage is sufficiently low.

Figure 7:
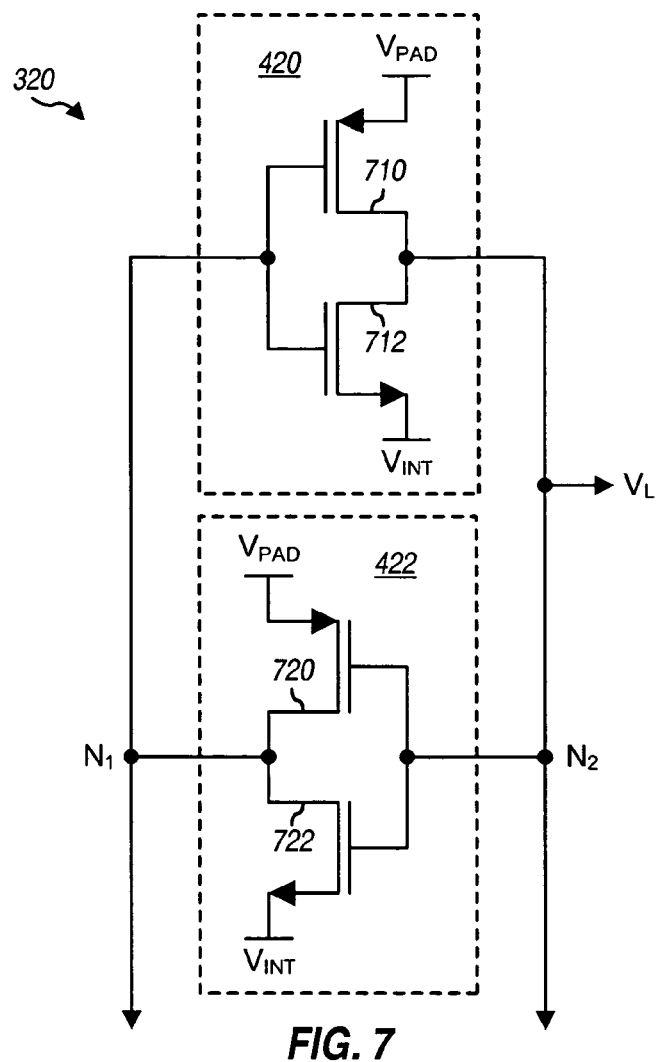
FIG. 7 shows a schematic diagram of a latch within the output driver.

FIG. 7 shows a schematic diagram of an embodiment of latch 320. For this embodiment, inverter 420 includes a P-FET 710 stacked with an N-FET 712. The gates of P-FET 710 and N-FET 712 couple together and form the input of inverter 420. The drains of P-FET 710 and N-FET 712 couple together and form the output of inverter 420. The source of P-FET 710 couples to $V_{PAD}$, and the source of N-FET 712 couples to $V_{INT}$. Inverter 422 includes a P-FET 720 and an N-FET 722 that are coupled in similar manner as P-FET 710 and N-FET 712, respectively. Inverters 420 and 422 operate between $V_{PAD}$ and $V_{INT}$.

Referring back to FIG. 4, latch driver 330 writes a zero to either node $N_1$ or $N_2$ based on the $V_{IN}$ signal. Latch 320 stores this zero as either logic low or logic high depending on the node being written to. Latch 320 provides a level-shifted $V_L$ signal that is at $V_{PAD}$ for logic high and is at $V_{INT}$ for logic low.

FIG. 4 also shows an embodiment of driver 360 within output driver 230b. For this embodiment, driver 360 includes P-FETs 460 and 462 and N-FETs 464 and 466 that are stacked together. P-FET 460 has its source coupled to $V_{PAD}$, its gate receiving the $V_1$ signal from buffer 340, and its drain coupled to the source of P-FET 462. P-FET 462 has its gate receiving a $V_P$ bias signal and its drain coupled to the drain of N-FET 464. N-FET 464 has its gate receiving a $V_N$ bias signal and its source coupled to the drain of N-FET 466. N-FET 466 has its gate receiving the $V_2$ signal from buffer 350 and its source coupled to $V_{SSP}$.

The $V_P$ and $V_N$ bias signals turn on P-FET 462 and N-FET 464, respectively, all the time. The $V_P$ bias signal has a voltage that is selected to prevent P-FETs 460 and 462 from violating their $V_{gs\_max}$ limits. Similarly, the $V_N$ bias signal has a voltage that is selected to prevent N-FETs 464 and 466 from violating their $V_{gs\_max}$ limits. The $V_N$ bias signal may be generated from $V_{CORE}$ or $V_{INT}$ and may also be coupled directly to $V_{CORE}$ or $V_{INT}$ if reliability can be assured by using the voltage for one of these voltage supplies. The $V_P$ bias signal may be coupled directly to $V_{INT}$ if reliability can be assured with the voltages for $V_{PAD}$ and $V_{INT}$. Alternatively, the $V_P$ bias signal may be generated with a reference circuit that can provide the desired voltage.

P-FETs 460 and 462 and N-FETs 464 and 466 operate as an inverter. When the $V_1$ and $V_2$ signals are at logic low, P-FET 460 is turned on by the $V_1$ signal, N-FET 466 is turned off by the $V_2$ signal, and P-FETs 460 and 462 drive the $V_{OUT}$ signal toward $V_{PAD}$. Conversely, when the $V_1$ and $V_2$ signals are at logic high, P-FET 460 is turned off by the $V_1$ signal, N-FET 466 is turned on by the $V_2$ signal, and N-FETs 464 and 466 pull the $V_{OUT}$ signal toward $V_{SSP}$. The $V_{OUT}$ signal thus swings the full voltage range from 0V to $V_{PAD}$ even though each FET within driver 360 swings only a fraction of the full range. If P-FETs 460 and 462 have the same size, then the voltage between $V_{PAD}$ and $V_{OUT}$ is divided equally between the two P-FETs. Similarly, if N-FETs 464 and 466 have the same size, then the voltage between $V_{OUT}$ and $V_{SSP}$ is divided equally between the two N-FETs.

FIG. 4 shows an embodiment in which two P-FETs and two N-FETs are stacked in driver 360. The number of P-FETs (L) and the number of N-FETs (L) to stack may be determined as shown in equation (3). L−1 P-FETs may be turned on all the time, and one P-FET (e.g., the topmost P-FET) may be controlled with the $V_1$ signal. Similarly, L−1 N-FETs may be turned on all the time, and one N-FET (e.g., the bottommost N-FET) may be controlled with the $V_2$ signal. L−1 bias signals may be used for the L−1 P-FETs that are turned on all the time, and L−1 bias signals may be used for the L−1 N-FETs that are turned on all the time. These bias signals may be generated based on $V_{CORE}$, $V_{INT}$ and/or $V_{PAD}$ such that all of the P-FETs and N-FETs do not violate their $V_{gs\_max}$ limits.

The signal inversion by driver 360 may be compensated in various manners. For example, buffers 340 and 350 may be replaced with inverters, the $V_{IN}$ signal may be inverted, the $\overline{V_{IN}}$ signal may be provided to gate control circuit 444, and the $\overline{V_{IN}}$ signal may be provided to gate control circuit 434, and so on.

The output driver described herein may have various advantages. First, the circuits within pre-driver 310 may operate based on digital signals. Each digital signal transitions between an upper voltage and a lower voltage for a specific voltage range. This avoids the need to generate bias and reference voltages for the pre-driver. Second, there may be no leakage paths for static current during steady state. Each circuit is turned off once steady state is reached. Third, N-FETs may be used as pull-down transistors in latch driver 330. N-FETs are much more effective than P-FETs at pulling down a node. Fourth, the digital $V_{IN}$ and $V_L$ signals for driver 360 may be buffered to achieve faster operating speed. Fifth, just about any $V_{PAD}$ and $V_{CORE}$ voltages may be supported by stacking a sufficient number of N-FETs and P-FETs and by generating the proper gate control signals in latch driver 330.

Figure 8:
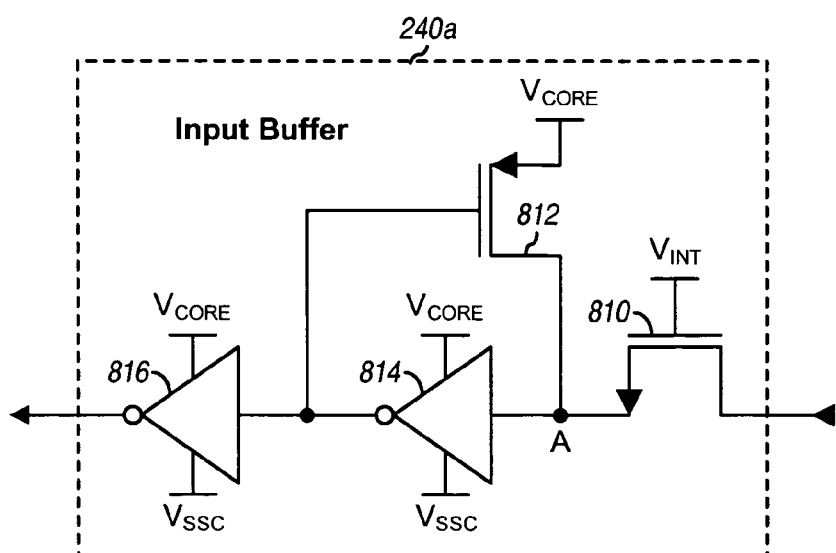
FIG. 8 shows a schematic diagram of the input buffer.

FIG. 8 shows a schematic diagram of an input buffer 240a, which is an embodiment of input buffer 240 in FIG. 2. For this embodiment, input buffer 240a includes an N-FET 810, a P-FET 812, and inverters 814 and 816. N-FET 810 has its drain coupled to I/O pad 210, its gate coupled to $V_{INT}$, and its source coupled to the input of inverter 814. P-FET 812 has its source coupled to $V_{CORE}$, its gate coupled to the output of inverter 814, and its drain coupled to the input of inverter 814. Inverters 814 and 816 are coupled in series. Inverter 816 provides a voltage-translated digital signal. $V_{INT}$ generated for the output driver is advantageously used for the input buffer.

N-FET 810 attenuates the digital signal received from I/O pad 210. N-FET 810 ensures that the voltage at node A, which is the input of inverter 814, is maintained below a large value when node A is driven from I/O pad 210. In general, L−1 N-FETs may be stacked and coupled between I/O pad 210 and the input of inverter 814, where L may be determined as shown in equation (3). P-FET 812 ensures that node A rises to $V_{CORE}$ once inverter 814 is tripped. The pull-up action by P-FET 814 is a form of positive feedback that speeds up inverter 814 and ensures that there is good switching on an input rising edge.

The output driver described herein may be fabricated in various IC processes such as CMOS, N-MOS, P-MOS, bipolar, bipolar-CMOS (Bi-CMOS), etc. The output driver may also be used for various types of IC, as noted above.

The previous description of the disclosed embodiments is provided to enable any person skilled in the art to make or use the present invention. Various modifications to these embodiments will be readily apparent to those skilled in the art, and the general principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a latch configured to provide a first digital signal having a first voltage range determined by a first supply voltage and an intermediate voltage; and
   a driver coupled to the latch and configured to receive both the first digital signal via the latch and an unlatched second digital signal and to provide a digital output signal, wherein the unlatched second digital signal has a second voltage range determined by a second supply voltage and circuit ground, wherein the digital output signal has a third voltage range determined by the first supply voltage and circuit ground, and wherein the first supply voltage is higher than the second supply voltage.

2. The integrated circuit of claim 1, wherein the latch comprises first and second inverters coupled between the first supply voltage and the intermediate voltage.

3. The integrated circuit of claim 1, further comprising:
   a latch driver coupled to the latch and configured to write logic values to the latch.

4. The integrated circuit of claim 3, wherein the latch comprises first and second nodes, and wherein the latch driver is configured to pull down the first or second node to write a logic value to the latch.

5. The integrated circuit of claim 4, wherein the latch driver is configured to pull down the first or second node for a predetermined time duration to write the logic value and to turn off after the predetermined time duration.

6. An integrated circuit comprising:
   a latch configured to provide a first digital signal having a first voltage range determined by a first supply voltage and an intermediate voltage;
   a latch driver coupled to the latch and comprising:
      a first set of at least two N-channel field effect transistors (N-FETs) stacked together and configured to pull down a first node within the latch to write a logic high to the latch, and
      a second set of at least two N-FETs stacked together and configured to pull down a second node within the latch to write a logic low to the latch; and
   a driver coupled to the latch and configured to receive the first digital signal and a second digital signal and to provide a digital output signal, wherein the second digital signal has a second voltage range determined by a second supply voltage and circuit ground, wherein the digital output signal has a third voltage range determined by the first supply voltage and circuit ground, and wherein the first supply voltage is higher than the second supply voltage.

7. The integrated circuit of claim 6, wherein the latch driver further comprises:
   a first control circuit configured to generate a first set of at least two control signals for the first set of at least two N-FETs, and
   a second control circuit configured to generate a second set of at least two control signals for the second set of at least two N-FETs.

8. The integrated circuit of claim 7, wherein the first set of at least two control signals turn on the first set of at least two N-FETs for a predetermined time duration to write the logic high to the latch and turn off at least one of the N-FETs after the predetermined time duration.

9. The integrated circuit of claim 1, further comprising:
   a first buffer coupled to the latch and the driver and configured to receive the first digital signal and to provide a first buffered signal having the first voltage range, wherein the driver is configured to receive the first buffered signal.

10. The integrated circuit of claim 9, further comprising:
    a second buffer coupled to the driver and configured to receive a digital input signal and to provide the second digital signal.

11. The integrated circuit of claim 1, wherein the driver comprises at least two P-channel field effect transistors (P-FETs) and at least two N-channel field effect transistors (N-FETs) coupled between the first supply voltage and circuit ground.

12. The integrated circuit of claim 11, wherein the at least two P-FETs and the at least two N-FETs are stacked together, wherein a topmost P-FET among the at least two P-FETs receives the first digital signal, and wherein a bottommost N-FET among the at least two P-FETs receives the second digital signal.

13. The integrated circuit of claim 1, wherein the latch and the driver comprise only thin-oxide field effect transistors (FETs).

14. An integrated circuit comprising:
    a latch configured to provide a first digital signal having a first voltage range determined by a first supply voltage and an intermediate voltage;
    an input buffer configured to receive a digital input signal having the third voltage range and to provide a buffered digital input signal having the second voltage range; and
    a driver coupled to the latch and configured to receive the first digital signal and a second digital signal and to provide a digital output signal, wherein the second digital signal has a second voltage range determined by a second supply voltage and circuit ground, wherein the digital output signal has a third voltage range determined by the first supply voltage and circuit ground, and wherein the first supply voltage is higher than the second supply voltage.

15. An integrated circuit comprising:
    a pre-driver configured to generate first and second digital signals based on a digital input signal and further including a latch, wherein the first digital signal is latched at the latch and has a first voltage range determined by a first supply voltage and an intermediate voltage, wherein the second digital signal is unlatched and has a second voltage range determined by a second supply voltage and circuit ground, and wherein the first supply voltage is higher than the second supply voltage; and
    a driver coupled to the pre-driver and configured to receive the first digital signal via the latch and the second digital signal exclusive of the latch and to provide a digital output signal having a third voltage range determined by the first supply voltage and circuit ground.

16. The integrated circuit of claim 15, wherein the pre-driver is configured to generate at least one digital control signal based on the digital input signal and to generate the first digital signal with the at least one digital control signal.

17. The integrated circuit of claim 15, wherein the first supply voltage is for an external device coupled to the integrated circuit, and wherein the second supply voltage is for circuitry within the integrated circuit.

18. The integrated circuit of claim 15, wherein the pre-driver and the driver comprise only thin-oxide field effect transistors (FETs).

19. The integrated circuit of claim 18, wherein each of the thin-oxide FETs in the pre-driver and the driver has a gate-to-source ($V_{gs}$) voltage that is less than the second supply voltage when the thin-oxide FET is turned on and conducting current.

20. An apparatus comprising:
means for generating first and second digital signals based on a digital input signal, wherein the first digital signal is latched at a latch and has a first voltage range determined by a first supply voltage and an intermediate voltage, wherein the second digital signal is unlatched and has a second voltage range determined by a second supply voltage and circuit ground, and wherein the first supply voltage is higher than the second supply voltage; and
means for providing a digital output signal based on the first digital signal as latched at the latch and the second digital signal as received exclusive of the latch, the digital output signal having a third voltage range determined by the first supply voltage and circuit ground.

21. The apparatus of claim 20, wherein the means for generating the first and second digital signals comprises
means for latching the digital input signal to generate the first digital signal.

22. The apparatus of claim 21, wherein the means for latching the digital input signal comprises
means for pulling down a first node or a second node based on a logic value of the digital input signal, and
means for storing the logic value.

23. The apparatus of claim 20, wherein the means for generating the first and second digital signals comprises:
means for generating at least one digital control signal based on the digital input signal, and
means for generating the first digital signal based on the at least one digital control signal.

24. A method comprising:
generating first and second digital signals based on a digital input signal, wherein the first digital signal is latched at a latch and has a first voltage range determined by a first supply voltage and an intermediate voltage, wherein the second digital signal is unlatched and has a second voltage range determined by a second supply voltage and circuit ground, and wherein the first supply voltage is higher than the second supply voltage; and
providing a digital output signal based on the first digital signal as latched at the latch and the second digital signal as received exclusive of the latch, the digital output signal having a third voltage range determined by the first supply voltage and circuit ground.

25. The method of claim 24, wherein the generating the first and second digital signals further comprises latching the digital input signal to generate the first digital signal.

26. An integrated circuit comprising:
an output driver configured
to receive an internal input signal having a first voltage range determined by a first supply voltage and an intermediate voltage,
to generate a first digital signal having the first voltage range,
to generate a second digital signal having a second voltage range determined by a second supply voltage and circuit ground, and
to provide a digital output signal having a third voltage range determined by the first supply voltage and circuit ground, wherein the first supply voltage is higher than the second supply voltage; and
an input buffer configured to receive an external input signal having the third voltage range and to provide a buffered input signal having the second voltage range.

27. The integrated circuit of claim 26, wherein the input buffer comprises:
an N-channel field effect transistor (N-FET) coupled to the intermediate voltage and configured to receive the external input signal, and
an inverter coupled to the N-FET and configured to receive the external input signal via the N-FET.

28. The integrated circuit of claim 27, wherein the input buffer further comprises a P-channel field effect transistor (P-FET) coupled to the second supply voltage and to an input and an output of the inverter.

29. The integrated circuit of claim 26, wherein the output driver and the input buffer comprise only thin-oxide field effect transistors (FETs).

* * * * *